United States Patent [19]
Lee et al.

[11] Patent Number: 5,731,597
[45] Date of Patent: Mar. 24, 1998

[54] FIELD EMITTER ARRAY INCORPORATED WITH METAL OXIDE SEMICONDUCTOR FIELD EFFECT TRANSISTORS AND METHOD FOR FABRICATING THE SAME

[75] Inventors: Jong Duk Lee, Department of Electronics Engineering College of Engineering, Seoul National University, Shin Lim-dong, Kwanak-ku, Seoul, Rep. of Korea; Cheon Kyu Lee, Seoul, Rep. of Korea; Dong Hwan Kim, Seoul, Rep. of Korea

[73] Assignees: Korea Information & Communication Co., Ltd.; Jong Duk Lee, both of Seoul, Rep. of Korea

[21] Appl. No.: 718,876

[22] Filed: Sep. 24, 1996

[30] Foreign Application Priority Data

Sep. 25, 1995 [KR] Rep. of Korea ............... 1995-31636

[51] Int. Cl.$^6$ ............... H01L 29/06; H01L 29/12
[52] U.S. Cl. ............... 257/10; 257/11; 257/368; 313/309; 313/310; 313/351; 437/192; 437/203; 437/204; 437/913
[58] Field of Search ............... 257/10, 11, 368; 313/351, 309, 310; 437/192, 203, 204, 913

[56] References Cited

U.S. PATENT DOCUMENTS

| | | | |
|---|---|---|---|
| 5,212,426 | 5/1993 | Kane | 315/169.1 |
| 5,268,648 | 12/1993 | Calcatera | 330/3 |
| 5,319,233 | 6/1994 | Kane | 257/350 |
| 5,359,256 | 10/1994 | Gray | 313/169 |
| 5,585,301 | 12/1996 | Lee et al. | 437/60 |
| 5,585,689 | 12/1996 | Imura et al. | 313/336 |

*Primary Examiner*—William Mintel
*Attorney, Agent, or Firm*—Dilworth & Barrese

[57] ABSTRACT

The present invention provides field emitter arrays (FEAs) incorporated with metal oxide semiconductor field effect transistors (MOSFETs) and method for fabricating the same which realizes a simultaneous fabrication of two kinds of devices, namely, an FEA and MOSFETs, by using common processing steps among the processes of fabricating Si-FEAs or metal FEAs and MOSFETs, wherein the method comprises steps of forming field emission tips and active regions for MOSFETs by oxidizing selected portions of a silicon nitride layer, forming a gate insulating oxide layer for the FEA and field oxide layers for MOSFETs simultaneously by the LOGOS method and connecting gate electrodes (row line) and cathode electrodes (column line) of the FEA to MOSFETs.

13 Claims, 5 Drawing Sheets

FIELD EMITTER ARRAY INCORPORATED WITH METAL OXIDE SEMICONDUCTOR FIELD EFFECT TRANSISTORS AND METHOD FOR FABRICATING THE SAME

BACKGROUND OF THE INVENTION

1. Field of the Invention

The present invention relates to a field emitter array (FEA) incorporated with metal oxide semiconductor field effect transistors (MOSFETs) integral therewith and a method for fabricating the same, and more particularly to an FEA which is fabricated on a single substrate together with MOSFETs for driving the FEA, thereby achieving improvement in the uniformity of pixels in a field emission display.

2. Description of the Prior Art

Recently, active research and development have been carried out for the field emission display (FED) which is a kind of flat panel display (FPD).

Generally, such an FED is basically comprised of an FEA to emit electrons and a circuit for driving the FEA. The FEA and its drive circuit are separately fabricated and then interconnected with each other to form a display module.

In order to electrically connect the FEA with its drive circuit, therefore, an additional process is required. This results in increase of the manufacturing cost of the FED.

SUMMARY OF THE INVENTION

The present invention has been made in view of the above-mentioned problems involved in the prior art, and an object of the invention is to eliminate the additional process required in connecting the FEA with MOSFETs adapted to drive the FEA by fabricating the FEA on a single substrate together with the MOSFETs, thereby not only achieving substantial reduction of the manufacturing cost of the FED, but also obtaining the uniformity of pixels of the FEA.

In order to accomplish this object, the present invention is intended to fabricate the metal-FEA simultaneously with MOSFETs on a single substrate by using the local oxidation of silicon (LOCOS) method.

BRIEF DESCRIPTION OF THE DRAWINGS

Other objects and aspects of the present invention will become apparent from the following description of embodiment with reference to the accompanying drawings in which.

DESCRIPTION OF THE PREFERRED EMBODIMENTS

A known method applied to the present invention is illustrated in FIGS. 1A to 1G. The method for fabricating a metal-FEA using the so-called LOCOS process will now be described in brief with reference to FIGS. 1A to 1G. This method is disclosed in, for example, the U.S. patent application Ser. No. 08/538,986.

Figure 1A:
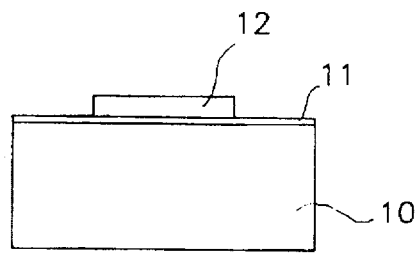
FIGS. 1A to 1G are sectional views respectively illustrating sequential steps of a method for fabricating a metal-FEA using the LOCOS process, which is applied to the present invention.

By using the conventional method, a doped silicon substrate 10, which will serve as the cathode electrode of the resultant FEA, is first prepared, and a thin oxide layer 11 is then formed on the silicon substrate 10 by thermally oxidizing the silicon substrate 10, as shown in FIG. 1A. A silicon nitride layer is then deposited to a desired thickness (for example, 1,600 Å) over the oxide layer 11.

The silicon nitride layer serves to prevent the silicon substrate 10 from being oxidized in the subsequent oxidation step.

Thereafter, silicon nitride layer patterns 12 with, for example, a diameter of 1.4 μm, are formed on the oxide layer 11 by the photolithography method using a photomask aligner, as shown in FIG. 1A.

Wet or dry oxidation process is then performed on the silicon substrate 10. As the result of this process, a thick oxide layer is formed on the silicon substrate 10 in such a manner that it has a substantial thickness in the region where the silicon nitride layer patterns 12 are not disposed, while having a bird's beak shape disposed beneath the edges of each silicon nitride layer pattern 12, as shown in FIG. 1B.

During its formation, the thick oxide layer serves to lift edge portions of the silicon nitride layer patterns 12. Thus, the resulting structure has the cross-sectional shape as shown in FIG. 1B. The thick oxide layer will serve as the insulating layers 13 between the cathodes and gate electrodes, when the resulting device operates.

The silicon nitride layer patterns 12 are subsequently wet etched so that they may be completely removed. The oxide layer 11 is then etched to the depth corresponding to the thickness obtained at the step in FIG. 1A, namely, a depth required to expose the silicon substrate 10 so that the silicon substrate 10 is partially exposed at its surface. Accordingly, the gaps between the adjacent insulating layers 13, which consequently define the diameters of the gate holes to be subsequently formed, become considerably smaller than the initial diameters of the silicon nitride layer patterns 12 due to the oxidation occurring in the formation of the thick oxide layer.

The silicon substrate 10 is then wet or dry etched at its exposed portion. By this etching process, an FEA structure shown in FIG. 10 is obtained without substantially affecting the shape of the insulating layers 13. Thus, gate holes 14 are prepared in the silicon substrate 10.

When the silicon substrate 10 is dry etched, it is desirable that $SF_6$ gas and low electric power are used. Under these conditions, it is possible to obtain a desired undercut shape without affecting the insulating layers 13. Of course, the etching method is not limited to the above-mentioned one.

Figure 1E:
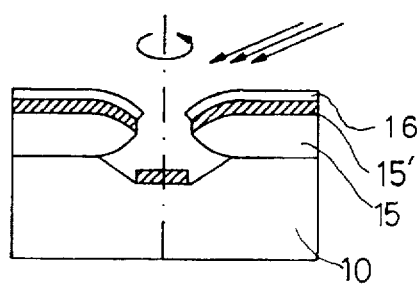
Figure 1B:
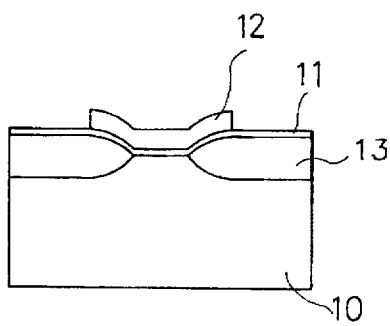
Figure 1F:
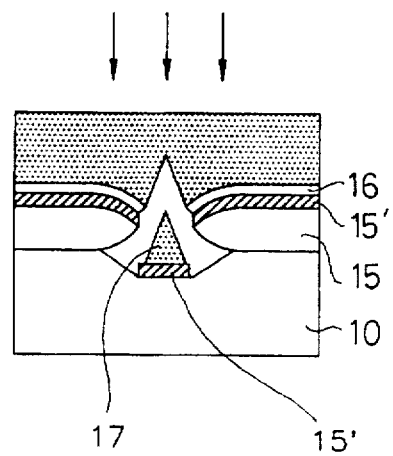
Figure 1C:
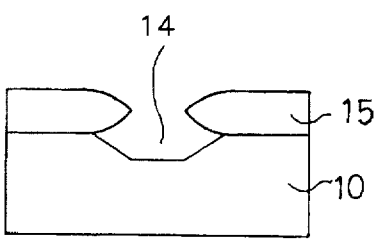
Figure 1D:
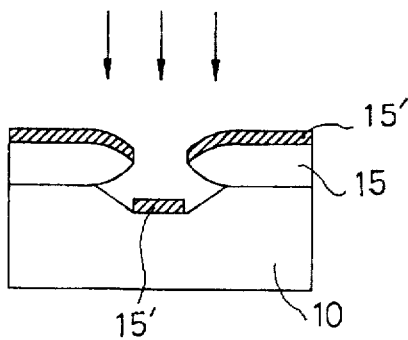

Thereafter, the silicon substrate 10 is mounted on an electron gun type deposition device to form a gate electrode layer 15 on the silicon substrate 10 as shown in FIG. 1D. The gate electrode layer 15 is formed by depositing a metal material over the surface of the silicon substrate 10 in such a manner that it is injected perpendicularly with respect to the surface of the silicon substrate 10. At this process, no metal material is deposited on lower surfaces of the insulating layers 13.

Molybdenum, niobium, chromium or hafnium may be used as the deposition material. Of course, the deposition material is not limited to those as above.

The subsequent process will then be conducted by using a so-called "Spindt process".

That is, the silicon substrate 10 is mounted on the electron gun type deposition device to form a parting layer 16 on the gate electrode layer 15 as shown in FIG. 1E. The formation of the parting layer 16 is achieved by depositing a deposition material over the gate electrode layer 15 in such a manner that it is injected at a grazing angle with respect to the surface of the silicon substrate 10. At this time, no deposition material is deposited on the surface of the silicon substrate 10. As the material of the parting layer 16, aluminum, aluminum oxide or nickel may be used.

Thereafter, field emission tips 17 are formed by injecting a metal perpendicularly with respect to the surface of the silicon substrate 10, as shown in FIG. 1F. Since the metal to be deposited is injected perpendicularly with respect to the surface of the silicon substrate 10, it is deposited over both the metal layer 15' disposed on the silicon substrate 10 and the parting layer 16. Accordingly, the gaps between the adjacent gate electrode layers 15 are gradually reduced and finally closed as the deposition of the metal material advances. As a result, the field emission tips 17 as formed have the cone shapes.

Molybdenum, niobium or hafnium may be used as material of the field emission tips 17. Of course, the material is not limited to those as above.

Figure 1G:
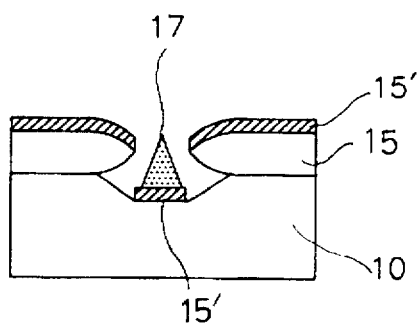

Subsequently, only the parting layers 16 disposed over the gate electrode layers 15 are selectively etched. By this process, the field emission tip material deposited over the gate electrode layers 15 is lifted off from the silicon substrate together with the parting layers 16. Thus, a metal-FEA having the structure shown in FIG. 1G is obtained.

In particular, the metal-FEA fabricated by the above-mentioned process may have gate holes with the diameters smaller than the sizes of the mask patterns. Accordingly, reduction in drive voltage can be easily achieved.

The present invention realizes the simultaneous fabrication of FEA and MOSFET by adding several masking steps to the above-mentioned process of fabricating a metal-FEA.

Embodiment

Figure 2:
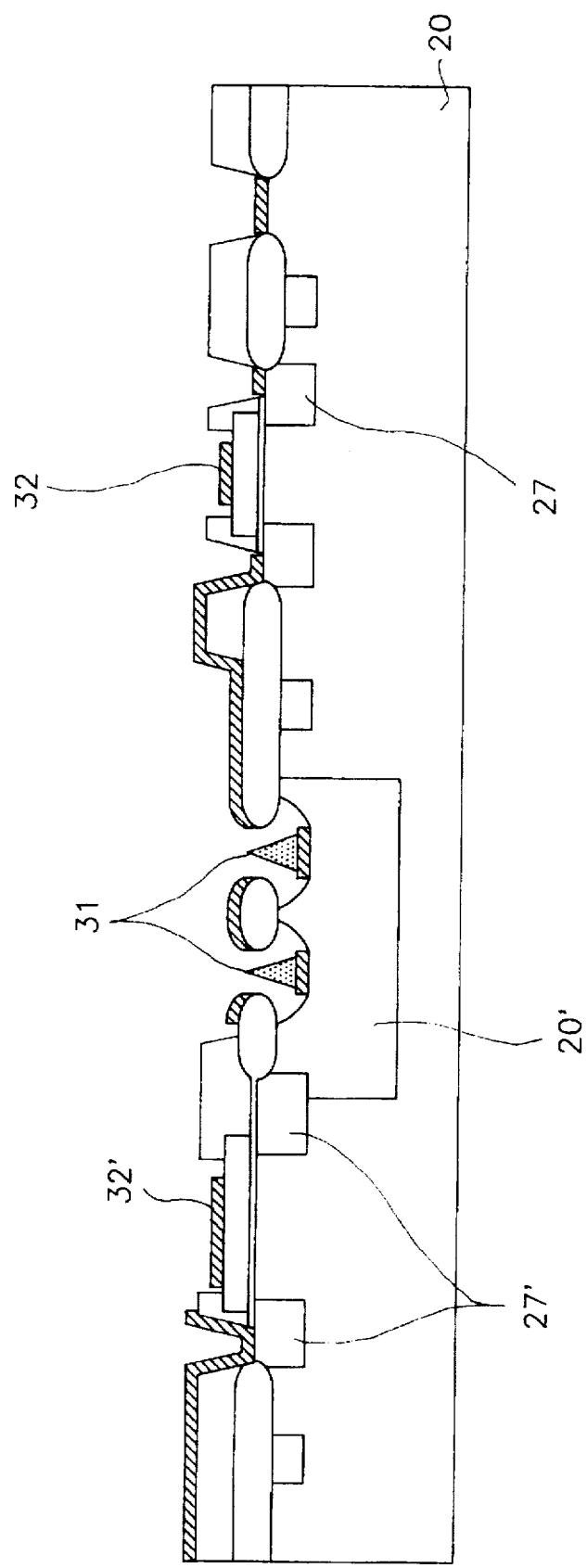
FIG. 2 is a sectional view illustrating an FEA incorporated with MOSFETs according to the present invention.

FIGS. 2 are sectional views respectively illustrating the FEA incorporated with MOSFETs. The FEA shown in FIG. 2 includes a P-type silicon substrate 20 formed with an n$^+$-doped silicon layer 20' serving as the cathode electrodes of the display, in which a FEA is formed on a certain portion of the silicon substrate 20', while MOSFETs are formed on the remaining portion of the silicon substrate 20. The FEA is provided with cone-shaped field emission tips 31 to emit electrons. The MOSFETs have n$^+$ sources 27, drains 27', and gate electrodes 32 and 32'. According to the present invention, the FEA is fabricated simultaneously with the MOSFETs for driving the FEA.

A method for fabricating the FEA incorporated with MOSFETs according to an embodiment of the present invention will now be described in detail with reference to FIGS. 3A–J.

Figure 3A:
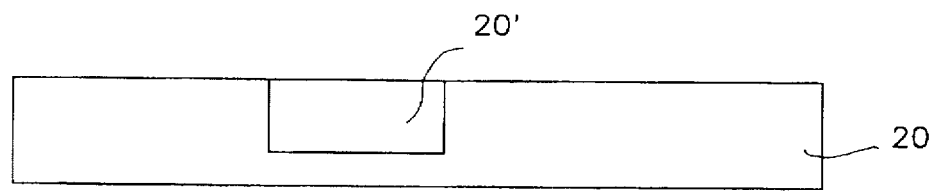
FIGS. 3A to 3J are sectional views respectively illustrating sequential steps of a method for fabricating the FEA incorporated with MOSFETs according to an embodiment of the present invention.

In this embodiment, a P-type silicon substrate 20 is first prepared, and an n$^+$-doped silicon layer 20', which serves to provide cathode electrodes, namely, column lines of a display, is formed in a certain portion of the silicon substrate 20 by using an appropriate method such as POC$_{13}$ doping, as shown in FIG. 3A.

Figure 3B:
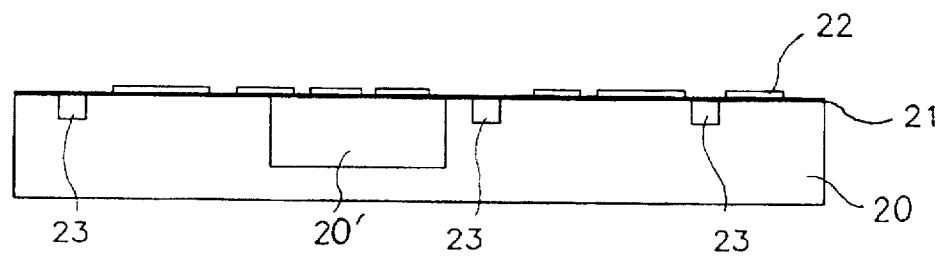

A thin oxide layer 21 is then formed over the resulting structure by thermally oxidizing the silicon substrate 20 and silicon layer 20', as shown in FIG. 3B. A silicon nitride layer is then deposited over the oxide layer 21. Thereafter, silicon nitride layer patterns 22 in the micron size are formed over the oxide layer 21 corresponding to active regions of the MOSFETs and the region where gate holes of the FEA will be formed by using the photolithography technique.

P$^+$ ions are then doped in the portions of the silicon substrate 20 exposed after the partial removal of the silicon nitride layer, thereby forming insulators 23 for providing a desired insulation between cathodes, and between pixels and transistors.

Figure 3C:
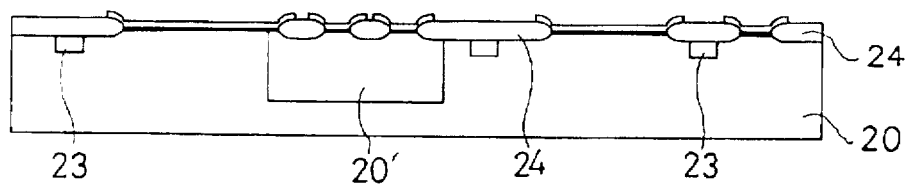

Thereafter, the silicon substrate 20 is oxidized, thereby forming a thick oxide layer in the regions where the silicon nitride layer was removed, as shown in FIG. 3C. Thus, insulating oxide layers 24 for the FEA and field oxide layers 24 for the MOSFETs are formed.

The remaining silicon nitride layers 22 and thin oxide layers 21 are then completely removed. Thermal oxidation is subsequently conducted to form an oxide layer (not shown). Thereafter, impurity ions are implanted in the desired portions of the P-type silicon substrate 20 so as to control the threshold voltage of the first and second MOSFETs, and the oxide layer is then removed. In this state, gate oxide layers 25 and 25' for the MOSFETs are then formed on the resulting structure according to the thermal oxidation process.

Figure 3D:
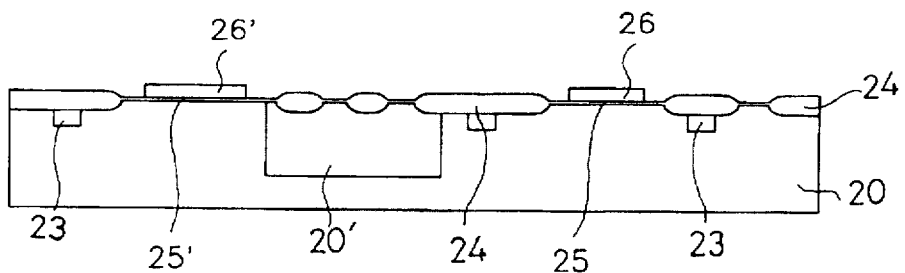

Polysilicon layers are then deposited over the gate oxide layers 25 and 25', respectively, as shown in FIG. 3D. These polysilicon layers are doped with n$^+$ ions and then patterned, thereby forming gates 26 and 26' for the first and second MOSFETs.

Figure 3E:
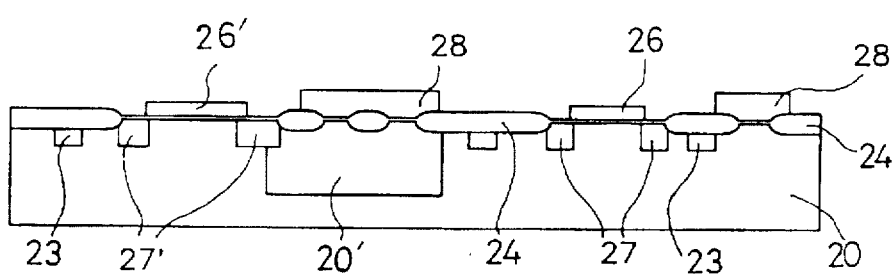

Formation of n$^+$ sources and drains 27 and 27' are then carried out by using a high concentration n-type ion implantation process, as shown in FIG. 3E. At this time, portions of the silicon substrate where impurity ions should not be implanted are covered with the photoresist layer 28.

Figure 3F:
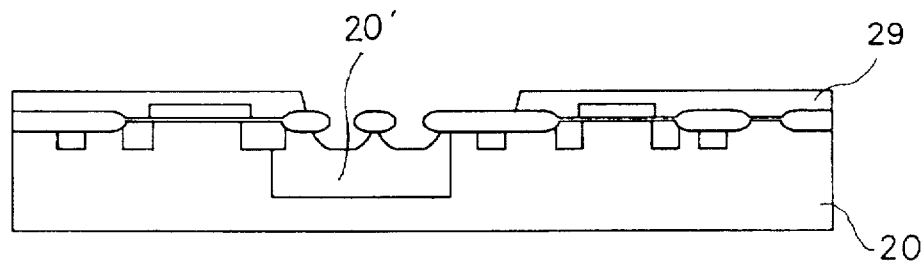

A low temperature oxide (LTO) layer 29 is then deposited over the entire exposed upper surface of the resulting structure, as shown in FIG. 3F. The LTO layer 29 is subsequently patterned by using the photolithography method so as to remove the portion disposed in a region where the FEA will be formed. The n$^+$-doped silicon layer 20' is then partially etched so as to remove its desired portions.

Figure 3G:
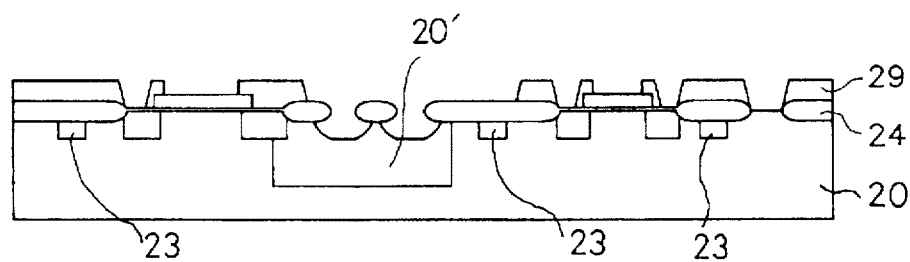
Figure 3H:
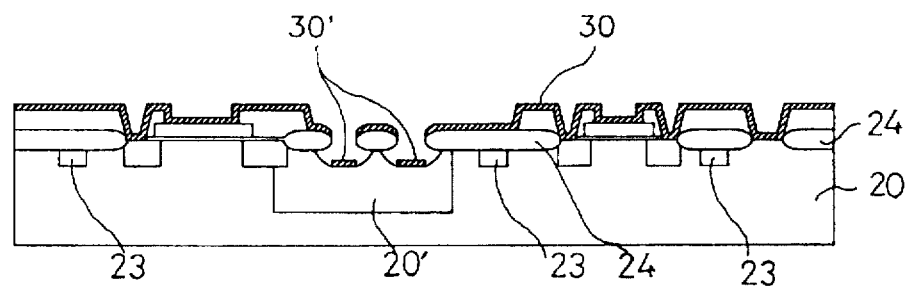
Figure 3I:
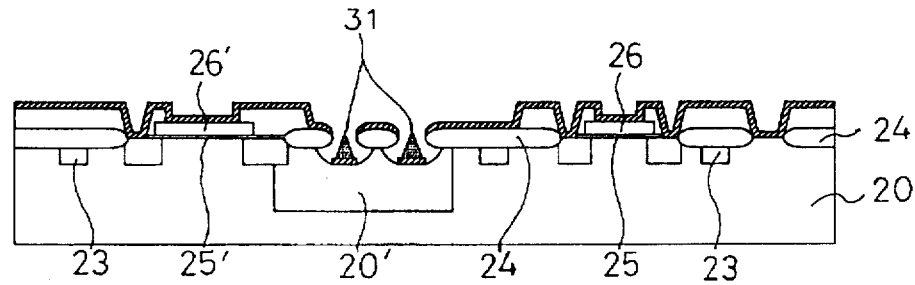

Patterning for forming contacts is then conducted by performing the photolithography method as shown in FIG. 3G. Using the electron gun type deposition device, a metal layer 30 is then deposited over the entire exposed surface of the resulting structure in such a manner that the metal is injected perpendicularly with respect to the surface of the silicon substrate 30, as shown in FIG. 3I.

Thereafter, the silicon substrate 20 is mounted on the electron gun type deposition device to form a parting layer (not shown) on the metal layer 30. The parting layer is formed by depositing a deposition material over the metal layer 30 in such a manner that it is injected at a grazing angle with respect to the surface of the silicon substrate 20.. At this time, no deposition material is deposited on the surface of the silicon substrate 20.

Thereafter, field emission tips 31 are formed by injecting a metal material perpendicularly with respect to the surface of the silicon substrate 20. Subsequently, only the parting layer is selectively etched. By this process, the field emission tip material deposited over the metal layer 30 is lifted off from the silicon substrate together with the parting layer.

Figure 3J:
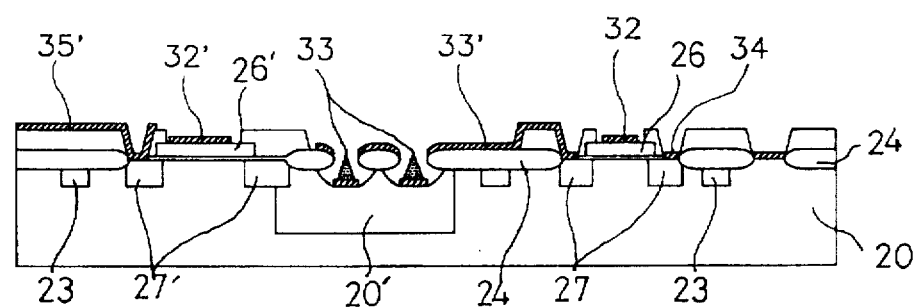

Finally, unnecessary portions of the resulting structure are removed by the photolithography process, thereby forming gate electrodes 33 of the FEA and gate electrodes 32 and 32', source electrodes 33' and 35' and drain electrodes 34 of the first and second MOSFETs. Thus, a device with the structure shown in FIG. 3J is obtained.

Figure 4:
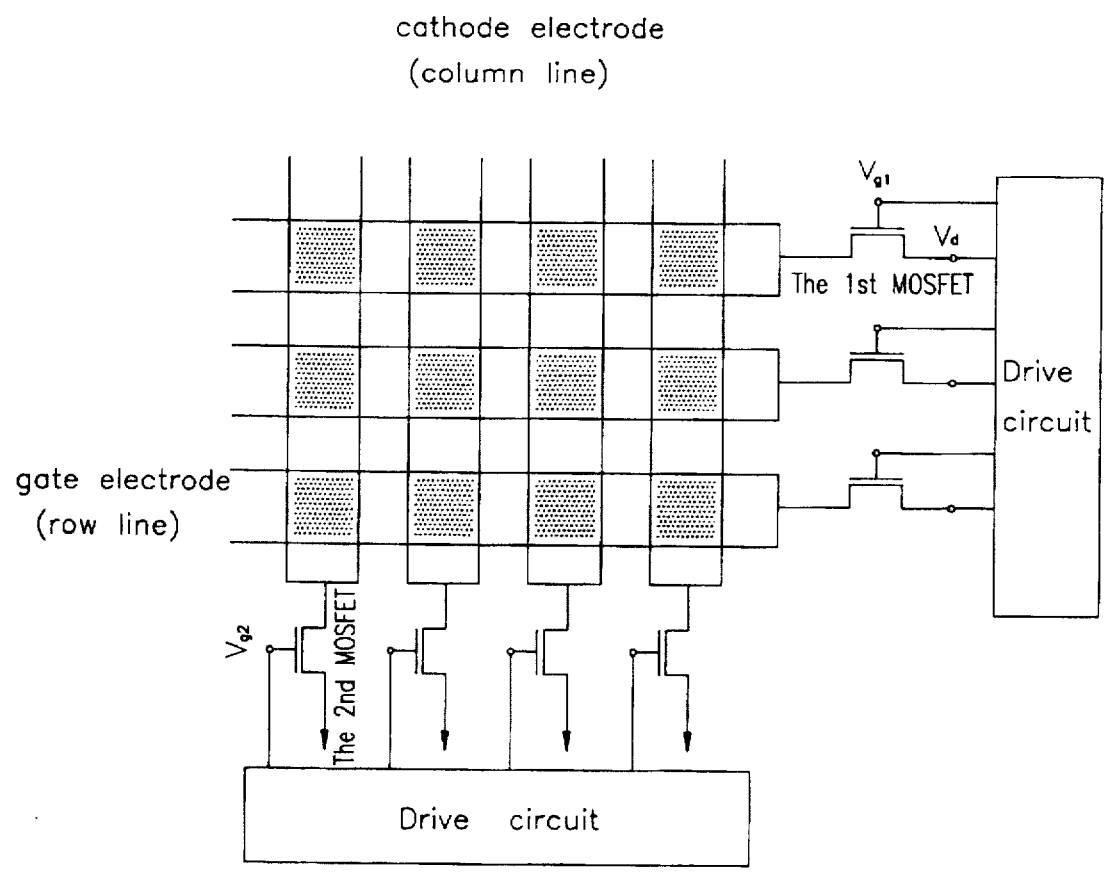
FIG. 4 is a block diagram illustrating an FED comprising the product according to the present invention.

FIG. 4 is a block diagram illustrating an FED fabricated with the products according to the present invention. In the FED, MOSFETs are connected to the gate electrodes on row lines of the FEA and to cathode electrodes on column lines of the FEA. In FIG. 4, the first MOSFET is connected to associated gate electrodes of the FEA so that it can apply voltage to the gate electrodes.

When a voltage $V_{g1}$ which is higher than a threshold voltage $V_\tau$ is applied to the gate terminal of the first MOSFET, it activates the first MOSFET. As a result, a drain voltage $V_d$ from the activated first MOSFET is applied to the associated gate electrodes of the FEA.

On the other hand, the second MOSFET connected to associated cathode electrodes of the FEA serves to ground or float the associated cathode electrodes. That is, when a voltage $V_{g2}$ which is higher than a threshold voltage $V_\tau$ is applied to the gate terminal of the second MOSFET, it activates the second MOSFET, thereby grounding the associated cathode electrodes of the FEA.

The second MOSFET may also serve to improve the uniformity among cathode electrodes arranged on column lines of the FEA. This function can be obtained by varying the gate voltage of the second MOSFET, thereby adjusting cathode current.

As apparent from the above description, the present invention provides an FEA which is fabricated on a single substrate together with MOSFETs to drive the FEA, thereby eliminating an additional process required in connecting the FEA and MOSFETs together. Accordingly, a great reduction in the manufacturing cost of the FED is achieved.

Furthermore, the present invention may be directly applied to the manufacture of a display module using a combination of the FEA and its drive circuit which is incorporated with the FEA.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A field emitter array (FEA) incorporated with metal oxide semiconductor field effect transistors (MOSFETs), which comprises
   a P-type silicon substrate formed with an n$^+$-doped silicon layer serving as a cathode electrode;
   an FEA formed on the P-type silicon substrate;
   a first MOSFET formed on one part of the P-type silicon substrate and being connected to a gate electrode of the FEA; and
   a second MOSFET formed on the other part of the P-type silicon substrate and being connected to the cathode electrode of the FEA.

2. A method for fabricating the FEA of claim 1 incorporated with MOSFETs, wherein silicon nitride layer disk patterns are formed on an oxide layer formed by thermally oxidizing the n$^+$ doped silicon layer on the P-type silicon substrate and then patterning the oxide layer by using the photolithography technique, wet or dry-oxidization and wet or dry-etching are carried out to form gate holes, and cone-shaped field emission tips are formed by metal deposition, further comprising the steps of:

forming a thin oxide layer over the silicon substrate and the said n$^+$-doped silicon layer;

depositing a silicon nitride layer over the oxide layer;

forming silicon nitride layer disk patterns on the portions of the oxide layer, corresponding to active regions of the MOSFETs and regions where the FEA will be formed, by the photolithography method;

forming insulators by p$^+$ doping the portions of the silicon substrate exposed after the partial removal of the silicon nitride layers in order to provide a desired insulation between adjacent pixels;

forming insulating oxide layers for the FEA and field oxide layers for the MOSFETs by oxidizing both of the silicon subsequent and the silicon layer by the LOCOS method;

forming gates for the MOSFETs by depositing polysilicon on the gate oxide layers, formed by the thermal oxidation, and subsequent impurities implantation;

forming n$^+$ sources and drains for the MOSFETs under the gate oxide layers by high concentration n$^+$ ion implantation;

depositing photoresist layers over the portions of the silicon substrate where the FEA will be formed;

depositing a low temperature oxide (LTO) layer over the entire exposed upper surface of the silicon substrate;

removing the LTO layer in the region where the FEA will be formed by using the photolithography process and etching the silicon layer;

depositing a metal layer in such a manner that the deposition material is injected perpendicularly with respect to the silicon surface of the silicon substrate; and removing unnecessary field emission tip material together with the parting layer by using the lift-off process.

3. The FEA of claim 1, wherein the FEA is formed on the n$^+$-doped silicon layer.

4. The FEA of claim 3, wherein the FEA is fabricated on a single substrate together with the first and the second MOSFETs to drive the FEA, thereby eliminating an additional step required to connect the FEA and MOSFETs together.

5. The FEA of claim 1, comprising a combination of the FEA and the first and second MOSFETs.

6. The FEA of claim 1, wherein said FEA comprises a pair of cone-shaped field emission tips to emit electrons.

7. The FEA of claim 6, wherein the field emission tips are deposited upon a gate electrode layer in turn deposited on the substrate.

8. The FEA of claim 3, wherein the FEA comprised a pair of cone-shaped field emission tips each deposited upon a gate electrode layer in turn deposited on the n$^+$-doped layer.

9. The FEA of claim 7, wherein the gate electrode layer is composed of at least one of molybdenum, niobium, chromium or hafnium and the field emission tips are composed by at least one of molybdenum, niobium or hafnium.

10. The FEA of claim 8, wherein the gate electrode layer is composed of at least one of molybdenum, niobium, chromium or hafnium and the field emission tips are composed by at least one of molybdenum, niobium or hafnium.

11. The FEA of claim 1, wherein
    the FEA comprises a pair of gate electrodes, and
    the first and second MOSFETs each comprise a pair of gate electrodes, a pair of source electrodes and a pair drain electrodes.

12. The FEA of claim 7, wherein
    the FEA comprises a pair of gate electrodes, and the first and second MOSFETs each comprise a pair of gate electrodes, a pair of source electrodes and a pair drain electrodes.

13. The FEA of claim 8, wherein
the FEA comprises a pair of gate electrodes, and the first and second MOSFETs each comprise a pair of gate electrodes, a pair of source electrodes and a pair drain electrodes.

* * * * *